United States Patent [19]

Togei

[11] 4,247,863
[45] Jan. 27, 1981

[54] SEMICONDUCTOR MEMORY DEVICE
[75] Inventor: Ryoiku Togei, Machida, Japan
[73] Assignee: Fujitsu Limited, Kawasaki, Japan
[21] Appl. No.: 937,937
[22] Filed: Aug. 30, 1978
[30] Foreign Application Priority Data Sep. 2, 1977 [JP] Japan .................................. 52-105607

[51] Int. Cl.³ ........................................... H01L 27/12
[52] U.S. Cl. ........................................ 357/49; 357/13;
357/88; 365/174; 365/175; 365/177
[58] Field of Search ............................. 357/49, 88, 13;
365/174, 175, 177, 185

[56] References Cited

U.S. PATENT DOCUMENTS

| | | | |
|---|---|---|---|
| 4,003,036 | 1/1977 | Jenne | 340/173 R |
| 4,079,358 | 3/1978 | Arntz | 365/118 |
| 4,123,771 | 10/1978 | Uchida | 357/23 |
| 4,136,349 | 1/1979 | Tsang | 357/13 |

OTHER PUBLICATIONS

Japanese Laid-Open Patent Specification No. 51-15938, Published Feb. 7, 1976.

Japanese Laid-Open Patent Specification, No. 51-93833, Published Aug. 17, 1976.

Primary Examiner—Martin H. Edlow
Attorney, Agent, or Firm—Staas & Halsey

[57] ABSTRACT

Disclosed herein is a small-sized semiconductor memory device, wherein an N+(P+)-type single region having an input function and an output function and an electrode for controlling the electrical potential in a P(N)-type Si substrate are provided on the top surface of the P(N)-type Si substrate. In order to store carriers, i.e., an information, in the bulk of the substrate, an N (P)-type buried layer is formed below the N+(P+)-type input-output region, mentioned above. Information is quickly transferred from or into the buried layer by means of the punch-through effect, which is realized by spreading a depletion layer formed at a PN junction between the input-output region and the Si substrate. Since the carriers are stored in the bulk of the substrate, the size of the memory device is reduced and the surface property of the device does not exert a harmful influence on the carriers.

9 Claims, 7 Drawing Figures

SEMICONDUCTOR MEMORY DEVICE

BACKGROUND OF THE INVENTION

1. Field of the Invention

The present invention relates to a semiconductor memory device.

2. Description of the Prior Art

It is well known to use an MOS semiconductor device in the semiconductor memory cell device, wherein an interface between an insulating film and a semiconductor material substrate is utilized for storing and transferring information. The MOS semiconductor device has a drawback in that the amount of charge Qss at the surface states impedes the enhancement of the information transferring speed and the improvement of noise reduction.

The known one-transistor semiconductor memory device with one capacitor is widely used in the art; however, the dimension of the device is disadvantageously large because the transistor for the gate and the capacitor for storing the electrical charge are arranged on a flat surface of the device.

The so-called merged-type semiconductor memory device is also known in the art. In this device one diffused region is used for inputting and outputting carriers, thereby providing the device with a region common to the source and the drain of the semiconductor device. This memory device is comparatively small in size but its properties, such as the speed of transferring the carriers, are rather inferior to those of the MOS semiconductor memory device.

SUMMARY OF THE INVENTION

It is therefore an object of the present invention to provide a semiconductor memory device having properties which are superior to those of the MOS-type semiconductor device.

It is another object of the present invention to improve the structure and properties of the above-mentioned merged-type semiconductor device and to thus provide the semiconductor memory device having excellent properties.

It is also a further object of the present invention to reduce the size of the known semiconductor memory devices.

In accordance with the present invention, there is provided a semiconductor memory device comprising:
  a semiconductor material substrate having a first conductivity type, and;
  a plurality of regions of the semiconductor material substrate, each region being isolated from another; wherein each of the isolated regions comprises:
    an input-output region having a second conductivity type to the first above-mentioned conductivity type and situated on a portion of the surface of the semiconductor material substrate;
    a controlling electrode in ohmic contact with another portion of the surface of the semiconductor material substrate, which portion is adjacent to the input-output region, and;
    a buried layer having the above-mentioned second conductivity type, this layer being formed within the semiconductor material substrate at such a depth that a depletion layer, which spreads depending upon the magnitude of the electrical potential established by the controlling electrode from the input-output region to the interior of the semiconductor material substrate, so that the depletion layer can come into contact with the buried layer.

BRIEF DESCRIPTION OF THE DRAWINGS

The present invention is illustrated in detail with reference to the accompanying drawings, wherein.

It should be noted that the drawings are schematically drawn to illustrate the principles of the invention.

DESCRIPTION OF PREFERRED EMBODIMENTS

Hereinafter, the semiconductor material and all the other layers formed on it will be collectively referred to as a wafer.

Figure 1:
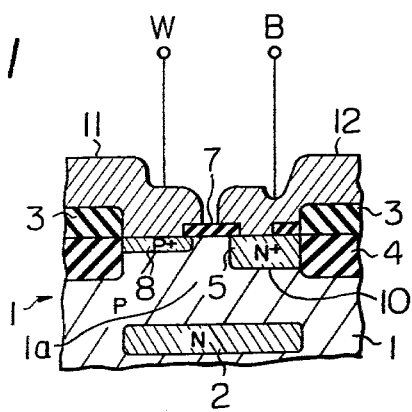
FIG. 1 is a schematic cross-sectional view of a semiconductor memory device according to an embodiment of the present invention, along the line I—I of FIG. 2.

In FIG. 1, a substrate 1 possesses a conductivity of a P-type and a concentration of impurities of usually about from $10^{14}$ to $10^{15}$ atoms per cubic cm. For the monocrystalline semiconductor material of the substrate 1, silicon is preferable. However, it should be noted that any semiconductor material adapted for conducting electrical charges can be used with the invention.

A buried layer 2 having the N conductivity type is formed in the P-type silicon substrate 1. The N-type buried layer 2 can be formed by ion-implanting phosphorous ions at a concentration ranging from $10^{14}$ to $10^{15}/cm^2$. The N-type buried layer 2 acts as a member corresponding to the capacitor of the conventional, one-transistor and one-capacitor memory device, and stores information therein.

Figure 2:
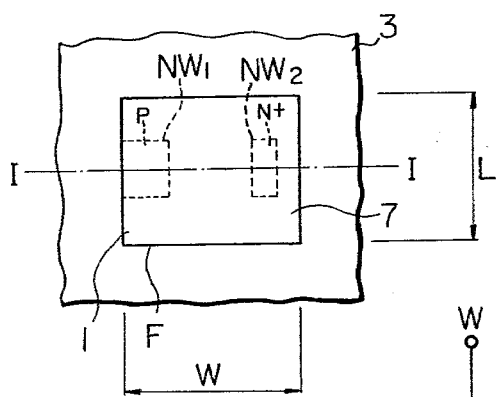
FIG. 2 is a plan view of FIG. 1.

An insulating region 4, shown in FIG. 1, which is the silicon dioxide film 4 formed by using the selective oxidation method, surrounds a portion of the silicon substrate 1 and isolates this cellular portion from the other cellular portions of the silicon substrate. In FIGS. 1 and 2, only one of the portions of the semiconductor substrate 1 surrounded and isolated by the insulating region 4 is shown. The insulating region 4 may be a highly doped P+-type layer but should preferably be a silicon dioxide layer, due to the reason given hereinafter in connection with FIG. 3.

An N+-type input-output region 5, which is hereinafter referred to as the N+-type I/O region, is formed on a portion of the surface of the semiconductor material substrate 1. The I/O region 5 usually has a thickness of about 0.5 micron and a surface impurity concentration of from $1 \times 10^{20}$ to $2 \times 10^{20}/cm^3$. A PN junction 10 is therefore established between the N+-type I/O region 5 and the P-type portion 1a, hereinafter referred to as the body of the silicon substrate.

On the surface of the semiconductor substrate 1, a silicon dioxide film 3 is formed to surround each of the isolated cellular regions (denoted as F in FIG. 2) of the silicon substrate 1. The silicon dioxide film 3 is formed simultaneously with the formation of the silicon dioxide film for the isolation region 4. The total thickness of both of the silicon dioxide films 3 and 4 may be 8000 Å or less.

On a surface portion adjacent to the N+-type I/O region 5 of the silicon substrate 1, the P+-type region 8 is formed so as to establish an ohmic contact between the terminal of a controlling electrode 11 and the silicon substrate 1. The distance between the adjacent ends of the regions 5 and 8 should be approximately one micron, but values other than one micron can be used.

A thin silicon dioxide film 7 is formed on the isolated region F to insulate the controlling electrode 11 from the electrode of the I/O region 5 and to selectively expose a portion of the P+-type layer 8 and the N+-type I/O region 5 in the respective electrode windows $NW_1$ and $NW_2$. A controlling electrode 11 of the word line W usually consisting of aluminum or polycrystalline silicon is brought into an ohmic contact with the exposed part of the P+-type layer 8.

When a reverse bias voltage is applied to the controlling electrode 11 connected to the word line W, the depletion layer (not shown in FIG. 1) will spread until it reaches the N-type buried layer 2, and accordingly, the so-called punch-through effect is realized in the silicon substrate 1. Due to the punch-through effect, information can be written into and read out of the N-type buried layer 2. The distance between the lower portion of the N+-type I/O region 5 and the upper portion of the N-type buried layer 2 should not be larger than 2 microns, but is usually from 1 to 2 microns. A semiconductor device utilizing the punch-through effect is disclosed in Japanese Patent Application No. 51-62606 of the present Inventor, which was disclosed on Dec. 5, 1977 as the Japanese Laid-Open Patent Application No. 52-146,186. In this semiconductor device, an electrical charge is transferred from the source to the drain regions of a semiconductor switching device, by means of the punch-through effect. In the present invention, since the punch-through effect is utilized with respect to the semiconductor memory device having a structure as shown in FIGS. 1 and 2, various advantages can be brought about. Firstly, the size of the semiconductor device is very much reduced. Namely, the width W of the isolated region F corresponds to a value ranging from 3 to 20 microns, and the length L thereof corresponds to a valve ranging from 3 to 20 microns. These values for the width and length of the isolated region F are considerably smaller than those of the above-mentioned switching device. By controlling the voltage applied to the substrate 1 through the electrode 11 connected to the word line W, the spread of the depletion layer (not shown) formed at the PN junction 10 can be changed to a desired amount. Therefore, the electrode 11 resembles the gate electrode of the MOS semiconductor device in the point that both electrodes control the width of the depletion layer. However, since the contact between the controlling electrode 11 and the P+-type layer 8 is ohmic, this invented device is not as critically influenced by the electrical and physical properties of the interface caused by the insulator film formation on the semiconductor substrate, as in the case wherein the characteristics of the MOS device are much influenced by the properties of the interface which is located under the controlling gate electrode. This noncritical influence of the interface gate structure is the second advantage of the present invention.

According to another embodiment of the present invention, the N-type buried layer 2 (FIG. 3) is brought, at its end, into contact with the insulating material, e.g., the silicon dioxide, of the insulating region 4. When the N-type buried layer 2 is in contact at its peripheral end with the insulating region 4, the electrical potential distribution in the semiconductor body 1a is advantageously changed in such a manner that the punch-through effect can be effectively realized.

The advantages of the present invention can be summarized as follows.

(1) Since the buried layer 2 acting as a capacitor is situated at a level lower than the I/O region 5, the semiconductor memory device can be highly densified, as compared to the one-transistor and one-capacitor memory device.

(2) The movement of the carrier is caused to occur entirely within the interior of the silicon substrate 1. Therefore, the semiconductor memory device according to the present invention is advantageous over the known MOS device, in the following features: the speed of writing and reading information is high due to the high mobility of the carriers in the bulk of the silicon substrate 1 and also due to the high movement of the carriers caused by a breakdown effect; noise is low because the electrical charge $Q_{ss}$ at the surface states exerts no influence upon the transfer of the carriers; the resistance against leak is high, because the leak of the carriers in the buried layer 2 via the interface between the electrodes 11, 12 and the silicon substrate 1 usually associated with the formation of the inversion layer at this interface does not occur, and the properties of the semiconductor device, particularly the storing property of the carriers in the N-type buried layer 2, are stable because of the above-mentioned high resistance against leak. Due to the above advantages, it is therefore possible to lengthen the period for refreshing the buried layer.

(3) The depletion layer spreads very sensitively depending upon the voltage of the controlling electrode; the channel modulation of the semiconductor memory device is thus large and the transconductance of the semiconductor memory device is therefore high.

Figure 4:
FIG. 4 shows pulses produced during the operation of writing the information "1"
Figure 4:
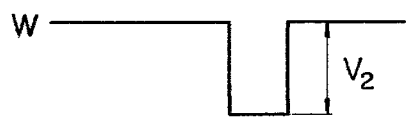
Figure 5:
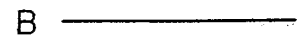
FIG. 5 shows a pulse produced during the operation of writing the information "0"
Figure 5:

The writing of information is performed by the application of pulse voltages to the electrodes 11 and 12, as shown in FIGS. 4 and 5.

As shown in FIG. 4 at the instant of writing the information "1", a negative pulse voltage having a predetermined value $V_1$ is applied through the bit line B to the N+-type I/O region 5, so that the potential of the electrons in this region 5 is increased to a high level. Simultaneously with the application of a pulse voltage through the word line W, a negative pulse voltage having an absolute value of voltage $V_2$ which is larger than that of $V_1$ is applied through the word line W to the substrate 1. The voltage $V_1$ is lower than $V_2$ by an amount of 1 volt or more. The time duration as well as the magnitude of these pulses is dependent upon the potential established in the N+-type I/O region 5 and the substrate body 1a in such a manner that the depletion layer (not shown in FIG. 1) spreads from the PN junction 10 until it reaches the N-type buried layer. As a result of the punch-through effect, the electrons i.e., the information, in the N+-type I/O region 5 are transferred or written into the buried layer 2.

An information "0", is defined as the non-existence of an electrical charge in the buried layer. The information "0" can be written by applying, as seen in FIG. 5, a zero pulse voltage to the N+-type I/O region 5, while a negative pulse voltage is applied to the P-type substrate body 1a. As a result of the application of these pulse voltages, the charge transfer will not occur if the electrons present in the N-type buried layer 2 were initially drained or had a low concentration. This condition can therefore be deemed as the non-existence of an electrical charge.

Figure 6:
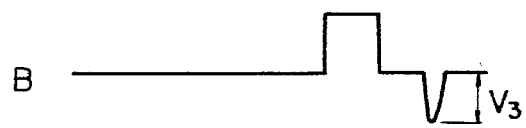
FIG. 6 shows pulses produced during the reading operation.
Figure 6:

The reading of the information is performed by, first applying a positive pulse voltage through the bit line B to the N+-type I/O region 5, as shown in FIG. 6. The electrons in the I/O region 5 are accordingly removed therefrom. Immediately after decreasing the pulse voltage to zero or to a reference value, usually after 10 nanoseconds, a negative pulse voltage is applied through the word line W to the P-type semiconductor body, with the result being that the electron potential in the semiconductor body 1a is lowered to such an extent so as to spread the depletion layer (not shown in FIG. 1) from the PN junction 10 to the N-type buried layer 2. Due to the punch-through state in the semiconductor material substrate 1, the electrons in the N-type buried layer are transferred through the substrate body 1a into the N+-type I/O region 5. When the electrons are transferred into the I/O region 5, a voltage drop therein as shown in FIG. 6, i.e., the information of "1", is observed. As is understood from the above-mentioned writing and reading processes, the movement of the carriers is entirely performed within the bulk of the semiconductor substrate according to the present invention.

During the storage of information in the N-type buried layer 2, minority carriers are generated therein, with the result being that the "0" state is changed to the "1" state. Accordingly, the N-type buried layer must be periodically (usually every 100 milliseconds) refreshed by the use of a known peripheral clocking circuitry.

Figure 7:
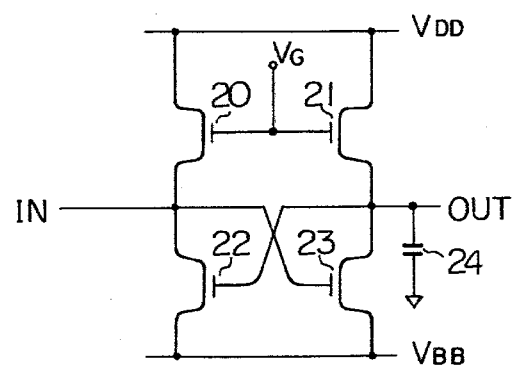
FIG. 7 shows the circuit of a sensing amplifier.

In order to amplify the output signal of the semiconductor memory device a highly sensitive detecting amplifier including MOS field-effect transistors as shown in FIG. 7 may be used. In FIG. 7, the reference numerals 20 through 23 respectively represent the MOS field-effect transistors, and the reference numeral 24 represents the generator of a reference voltage. The word "IN" represents the input of the amplifier and is connected to the I/O electrode 5 (FIGS. 1 and 3) through a gate transistor (not shown), while the word "OUT" represents the output of the amplifier.

It is relatively easy to produce the semiconductor memory device according to the present invention. For example, the following steps can be employed for producing the device.

Figure 3:
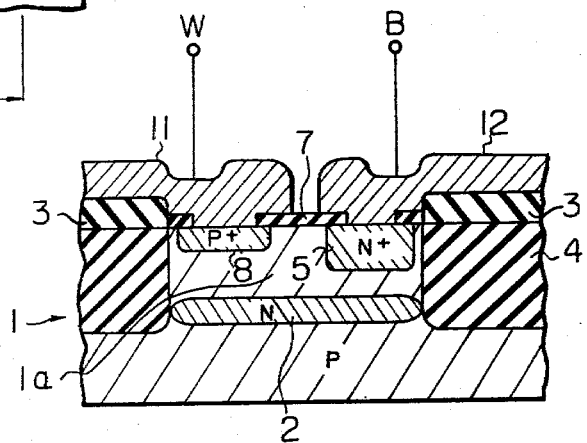
FIG. 3 is a drawing similar to FIG. 1, which shows the semiconductor memory device according to another embodiment of the present invention.

The isolation region 4 and the film 3 are simultaneously formed on the silicon substrate 1 by utilizing the known selective oxidation method. The insulating film formed on the wafer as a mask for the oxidation is then removed to form a window pattern for the isolated region F. The N-type buried layer 2 is formed by, for example, ion-implanting the N-type impurity through the window pattern. A mask for selectively exposing a portion of the silicon substrate 1 is formed on the wafer, and the N-type impurity is then introduced into this exposed portion to form the N+-type I/O region 5. In addition, a mask for selectively exposing another portion of the silicon substrate 1 is formed on the wafer, and the P-type impurity is then introduced into this exposed portion to form the P+-type layer 8. Next electrode windows $NW_1$ and $NW_2$ are formed by the photoetching process. Subsequently, the metal is deposited on the entire wafer and is then selectively removed to form a wiring, or electrodes, portions of which are shown in FIGS. 1 and 3 by the reference numerals 11 and 12.

The number of steps for producing the semiconductor memory device, which are not difficult steps at all as explained above, is not essentially increased as compared with those for producing the known one-transistor and one-capacitor memory device.

It would be obvious for skilled workers in the art to consider a device wherein respective parts of the wafer above have conductivity types opposite to the types described hereinbefore.

What I claim is:

1. A semiconductor memory device comprising:
   a semiconductor material substrate having a first conductivity type; and
   first regions for dividing said semiconductor material substrate into a plurality of second regions isolated one from another;
   wherein each of said second isolated regions comprises:
   an input-output region having a second conductivity type opposite to said first conductivity type, each said input-output region being situated at a respective first portion of the surface of said semiconductor material substrate;
   a control electrode in ohmic contact with a respective control portion of said surface of the semiconductor material substrate of the respective isolated region, said control portion comprising a region of said substrate being spaced from the input-output region of said isolation region; and
   a buried layer having said second conductivity type, said layer lying within said semiconductor material substrate at such a depth that a depletion layer spreads, depending upon the magnitude of an electrical potential established by said control electrode, from the position below said input-output region to the interior of said semiconductor material substrate, wherein said depletion layer can come into contact with said buried layer.

2. A semiconductor memory device according to claim 1, wherein each said first region comprises an insulating material and each said first region contacts said buried layer.

3. A semiconductor memory device according to claim 1 or 2, wherein the concentration of an impurity having said first conductivity type in said semiconductor material substrate ranges from $10^{14}$ to $10^{15}$/cm$^3$.

4. A semiconductor memory device according to claims 1 or 2, said input-output region having a thickness of approximately 0.5 micron and a surface impurity concentration from $1\times10^{20}$ to $2\times10^{\circ}$/cm$^3$.

5. A semiconductor device according to claims 1 or 2, wherein the distance between said input-output region and said second respective portion on which said controlling electrode is formed, is approximately one micron.

6. A semiconductor memory device according to claims 1 or 2, wherein the distance between the lower portion of said input-output region and the upper portion of said buried layer is not larger than 2 microns.

7. A semiconductor memory device according to claims 1 or 2, wherein the width of each said second isolated region ranges from 3 to 20 microns and the length thereof ranges from 3 to 20 microns.

8. The device of claims 1, 2 or 3, said control portion of said surface of said substrate comprising a region of said first conductivity type but of higher conductivity than said substrate.

9. The device of claim 2, said first region contacting said buried layer in each said isolation region at the peripheral edge of said buried layer.

* * * * *

UNITED STATES PATENT AND TRADEMARK OFFICE
CERTIFICATE OF CORRECTION

PATENT NO. : 4,247,863
DATED : January 27, 1981
INVENTOR(S) : Ryoiku Togei

It is certified that error appears in the above—identified patent and that said Letters Patent is hereby corrected as shown below:

```
Front page, item [57] Abstract, line 7, delete "an".
Column 1, line 50, ", and;" should be --; and--;
        *line 61, ", and;" should be --; and--.
Column 3, line 5, "A" should be --Å--.
Column 4, line 59, "lower" should be --less--;
        *line 66, after "electrons" insert --,--;
        *line 67, after "information" delete ","; after
    "5" insert --,--.
Column 5, line 12, after "by" delete ",";
        *line 42, after "device" insert --,--.
Column 6, line 59, "10°" should be --10$^{20}$--.
```

Signed and Sealed this

Eighteenth Day of August 1981

[SEAL]

Attest:

Attesting Officer

GERALD J. MOSSINGHOFF

Commissioner of Patents and Trademarks